United States Patent
Chang et al.

(10) Patent No.: US 6,829,174 B2
(45) Date of Patent: Dec. 7, 2004

(54) METHOD OF NARROWING THRESHOLD VOLTAGE DISTRIBUTION

(75) Inventors: Yao-Wen Chang, Hsinchu (TW); Tao-Cheng Lu, Kaoshiung (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 10/248,572

(22) Filed: Jan. 30, 2003

(65) Prior Publication Data

US 2004/0151030 A1 Aug. 5, 2004

(51) Int. Cl.$^7$ .................................................. G11C 7/00
(52) U.S. Cl. ............. 365/185.29; 365/218; 365/230.04; 365/185.24
(58) Field of Search ........................... 365/185.29, 218, 365/230.04, 185.24

(56) References Cited

U.S. PATENT DOCUMENTS

| | | | |
|---|---|---|---|
| 5,185,718 A | * | 2/1993 | Rinerson et al. ....... 365/185.12 |
| 5,233,559 A | * | 8/1993 | Brennan, Jr. ............ 365/185.09 |
| 5,450,363 A | * | 9/1995 | Christopherson et al. ..... 341/98 |
| 5,574,879 A | * | 11/1996 | Wells et al. ................. 711/100 |
| 5,856,942 A | * | 1/1999 | Lee et al. .............. 365/185.11 |
| 5,862,073 A | * | 1/1999 | Yeh et al. .............. 365/185.01 |
| 6,046,940 A | * | 4/2000 | Takeuchi et al. ........ 365/185.17 |
| 6,243,839 B1 | * | 6/2001 | Roohparvar ................. 714/718 |
| 6,246,608 B1 | * | 6/2001 | Odani ...................... 365/185.2 |
| 6,301,153 B1 | * | 10/2001 | Takeuchi et al. ........ 365/185.11 |
| 6,567,302 B2 | * | 5/2003 | Lakhani .................. 365/185.03 |
| 6,597,609 B2 | * | 7/2003 | Chevallier ................... 365/201 |

FOREIGN PATENT DOCUMENTS

| | | | | | |
|---|---|---|---|---|---|
| JP | 404260000 A | * | 9/1992 | ........... G11C/29/00 |
| JP | 405325573 A | * | 12/1993 | ........... G11C/16/02 |

* cited by examiner

*Primary Examiner*—Viet Q. Nguyen
(74) *Attorney, Agent, or Firm*—Jiang Chyun IP Office

(57) ABSTRACT

A method of narrowing the threshold voltage distribution in a memory. The method includes separating the erase and erase identification of odd memory cells from the erase and erase identification of even memory cells in an advanced non-volatile memory so that the distribution of the threshold voltage is narrowed.

6 Claims, 3 Drawing Sheets

METHOD OF NARROWING THRESHOLD VOLTAGE DISTRIBUTION

BACKGROUND OF INVENTION

1. Field of Invention

The present invention relates to a method of narrowing threshold voltage distribution. More particularly, the present invention relates to a method of separating out erase and erase identification of odd memory cells from erase and erase identification of even memory cells in an advanced non-volatile memory such that threshold voltage distribution is narrowed.

2. Description of Related Art

A non-volatile memory (such as a flash memory) is a type of electrically erasable programmable read only memory (EEPROM) capable of receiving program data, erasing stored data and retaining data even when power to the memory is cut. With such advantages, non-volatile memory is one of the most widely used memory devices inside personal computers and electronic equipment.

As fabrication techniques continue to improve, miniaturization is a principle goal in the design of non-volatile memory. As a result, miniaturized advanced non-volatile memory is developed. An advanced non-volatile memory includes a plurality of odd memory cells and a plurality of even memory cells. For an advanced non-volatile memory, if there is contact misalignment, erase speed in the odd memory cells will differ from erase speed in the even memory cells. When the contact is close to an odd memory cell, the erase speed of the odd memory cell will be slower than the erase speed of the even memory cell. However, in a conventional advanced non-volatile memory, the erase and erase identification of the odd memory cells and the even memory cells are carried out together. Hence, the distribution of threshold voltage for triggering an erasing operation in a conventional advanced non-volatile memory is wide. The wide distribution of threshold voltage has serious consequences for advanced non-volatile memory. For example, should the memory be over-erased in an erasing operation, a negative threshold voltage may be produced leading to an abnormal functioning of the advanced non-volatile memory.

SUMMARY OF INVENTION

Accordingly, one object of the present invention is to provide a method of narrowing the threshold voltage distribution of a memory device. This invention utilizes the separation of erase and erase identification of the odd memory cells from the erase and erase identification of the even memory cells to narrow down the distribution of threshold voltage in an advanced non-volatile memory. Thus, the disadvantages of having too large a distribution of threshold voltage in a conventional advanced non-volatile memory are eliminated.

To achieve these and other advantages and in accordance with the purpose of the invention, as embodied and broadly described herein, the invention provides a method of narrowing the threshold voltage distribution of a memory. The method is applicable to a contact misaligned advanced non-volatile memory. The advanced non-volatile memory includes a plurality of odd memory cells and a plurality of even memory cells. In the method, erase and erase identification of all the odd memory cells are carried out first and then followed by the erase and erase identification of all the even memory cells.

In one embodiment of this invention, the erasing speed of the odd memory cells differs from the erasing speed of the even memory cells. If the gate-coupling ratio of the odd memory cells is smaller than the gate-coupling ratio of the even memory cells, the erasing speed of the odd memory cells will be slower than the erasing speed of the even memory cells. On the other hand, if the gate-coupling ratio of the odd memory cells is larger than the gate-coupling ratio of the even memory cells, the erasing speed of the odd memory cells will be faster than the erasing speed of the even memory cells.

In another embodiment of this invention, the erase identification speed of the odd memory cells differs from the erase identification speed of the even memory cells. If the gate-coupling ratio of the odd memory cells is smaller than the gate-coupling ratio of the even memory cells, the erase identification speed of the odd memory cells will be slower than the erase identification speed of the even memory cells. On the other hand, if the gate-coupling ratio of the odd memory cells is larger than the gate-coupling ratio of the even memory cells, the erase identification speed of the odd memory cells will be faster than the erase identification speed of the even memory cells.

This invention also provides a method of narrowing the threshold voltage distribution of a memory. The method is applicable to a contact misaligned advanced non-volatile memory. The advanced non-volatile memory includes a plurality of odd memory cells and a plurality of even memory cells. In the method, program and program identification of all the odd memory cells are carried out first and then followed by the program and program identification of all the even memory cells.

In one embodiment of this invention, the programming speed of the odd memory cells differs from the programming speed of the even memory cells. If the gate-coupling ratio of the odd memory cells is smaller than the gate-coupling ratio of the even memory cells, the programming speed of the odd memory cells will be slower than the programming speed of the even memory cells. On the other hand, if the gate-coupling ratio of the odd memory cells is larger than the gate-coupling ratio of the even memory cells, the programming speed of the odd memory cells will be faster than the programming speed of the even memory cells.

In another embodiment of this invention, the program identification speed of the odd memory cells differs from the program identification speed of the even memory cells. If the gate-coupling ratio of the odd memory cells is smaller than the gate-coupling ratio of the even memory cells, the program identification speed of the odd memory cells will be slower than the program identification speed of the even memory cells. On the other hand, if the gate-coupling ratio of the odd memory cells is larger than the gate-coupling ratio of the even memory cells, the program identification speed of the odd memory cells will be faster than the program identification speed of the even memory cells.

In brief, this invention utilizes the separation of the erase and erase identification of the odd memory cells from the erase and erase identification of the even memory cells to narrow the distribution of threshold voltage in an advanced non-volatile memory. Hence, this invention is capable of eliminating all the weaknesses caused by too large a threshold voltage distribution as in a conventional advanced non-volatile memory.

It is to be understood that both the foregoing general description and the following detailed description are exemplary, and are intended to provide further explanation of the invention as claimed.

BRIEF DESCRIPTION OF DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DETAILED DESCRIPTION

Figure 1:
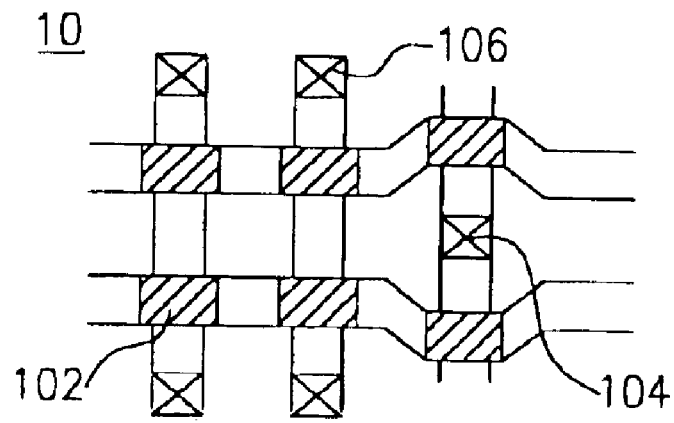
FIG. 1 is a structural diagram showing a NOR gate type flash memory.

Reference will now be made in detail to the present preferred embodiments of the invention, examples of which are illustrated in the accompanying drawings. Wherever possible, the same reference numbers are used in the drawings and the description to refer to the same or like parts.

Flash memory is one type of non-volatile memories. To understand the basic structure of a flash memory, an example is given in FIG. 1. FIG. 1 is a structural diagram showing a NOR gate type flash memory. As shown in FIG. 1, the flash memory 10 includes a floating gate 102, a source contact 104 and a bit line contact 106.

Figure 2:
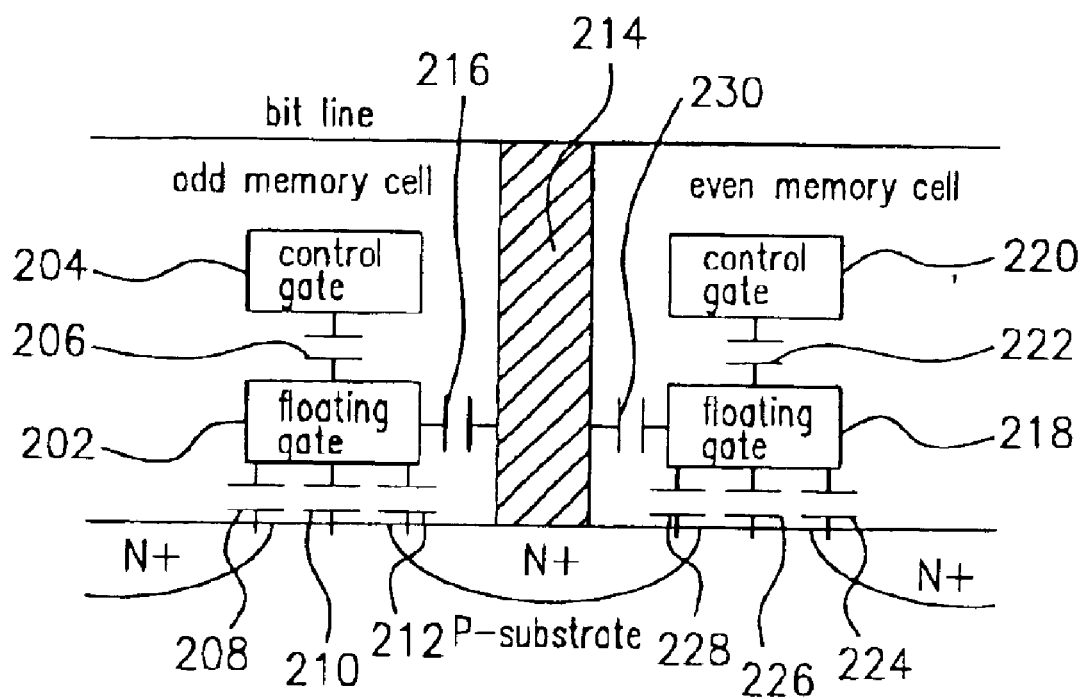
FIG. 2 is a cross-sectional diagram showing an odd memory cell and an even memory cell inside a non-volatile memory.

The non-volatile memory includes a plurality of odd memory cells and a plurality of even memory cells. FIG. 2 is a cross-sectional diagram showing an odd memory cell and an even memory cell inside a non-volatile memory. As shown in FIG. 2, total capacitance ($C_{t1}$) of the odd memory cell includes the capacitance ($C_{ONO1}$) 206 between a floating gate 202 and a control gate 204, the capacitance of capacitors 208, 210, 212 and the contact capacitance ($C_{cont1}$) 216 between the floating gate 202 and a contact 214. The gate-coupling ratio (GCR) of the odd memory cell $GCR_{Odd} = C_{ONO1}/C_{t1}$. Similarly, total capacitance ($C_{t2}$) of the even memory cell includes the capacitance ($C_{ONO2}$) 222 between a floating gate 218 and a control gate 220, the capacitance of capacitors 224, 226, 228 and the contact capacitance ($C_{cont2}$) 230 between the floating gate 218 and a contact 214. The gate-coupling ratio (GCR) of the even memory cell $GCR_{Even} = C_{ONO2}/C_{t2}$. In general, because the contact capacitance ($C_{cont1}$) 216 and the contact capacitance ($C_{cont2}$) 230 are small, their values are ignored. However, for the miniature advanced non-volatile memory, contact capacitance cannot be ignored and hence must be added to the total capacitance, thereby lowering the gate-coupling ratio.

Figure 3:
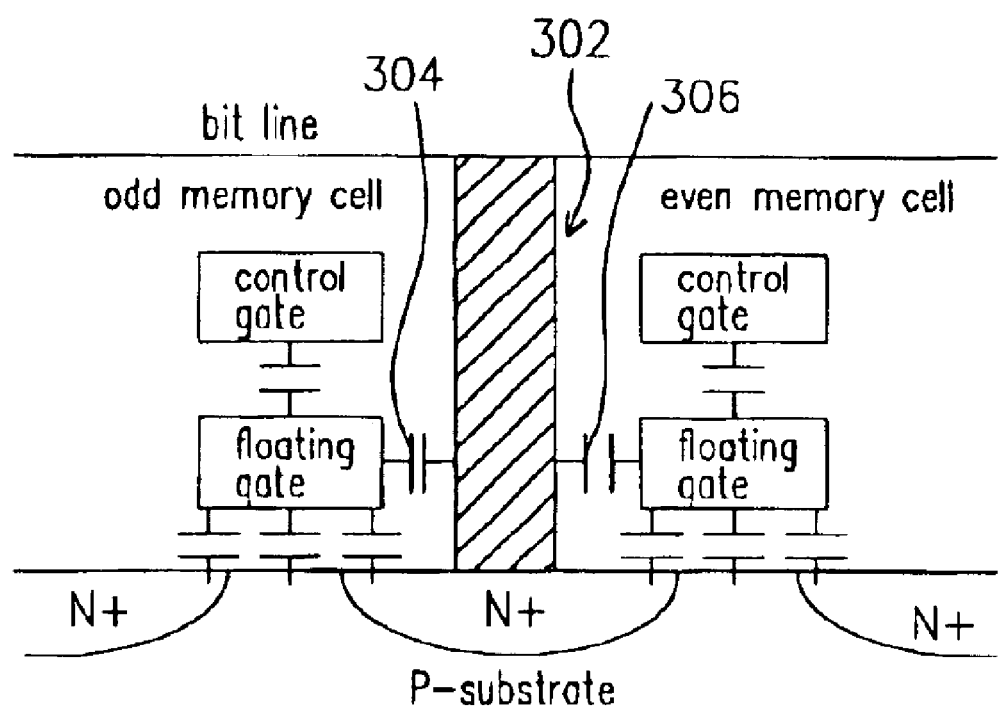
FIG. 3 is a cross-sectional diagram showing an odd memory cell and an even memory cell inside a non-volatile memory with a misaligned contact.

In the following, an advanced non-volatile memory having non-aligned contact is described. FIG. 3 is a cross-sectional diagram showing an odd memory cell and an even memory cell inside a non-volatile memory with a misaligned contact. As shown in FIG. 3, the contact 302 is closer to the odd memory cell and farther away from the even memory cell. Hence, the odd memory cell will have a contact capacitance ($C_{cont1}$) 304 greater than the contact capacitance ($C_{cont2}$) 306 of the even memory cell. Therefore, the odd memory cell will have a gate-coupling ratio ($GCR_{Odd}$) smaller than the gate-coupling ratio ($GCR_{Even}$) of the even memory cell.

Figure 4:
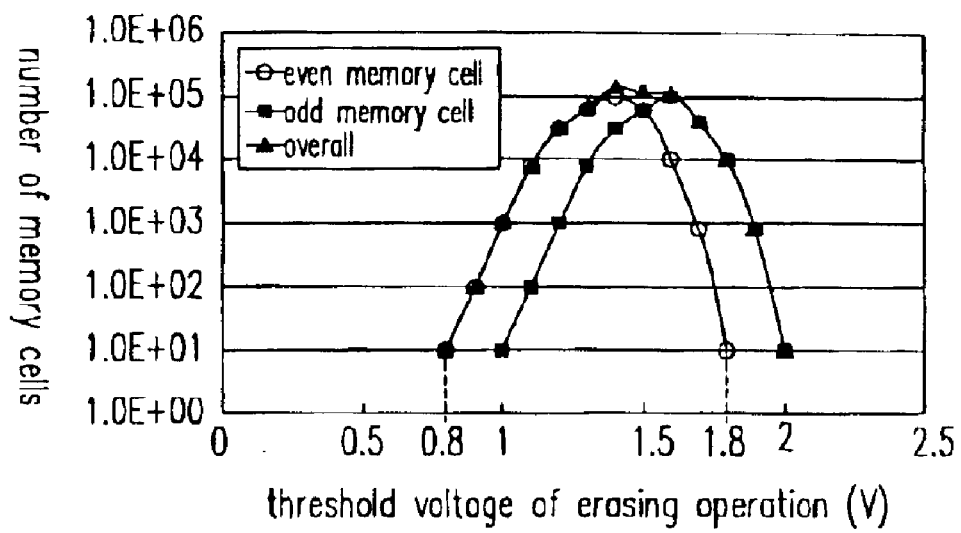
FIG. 4 is a graph showing the distribution of erase threshold voltage for a conventional advanced non-volatile memory.

Since the odd memory cell has a gate-coupling ratio smaller than the even memory cell, the erase speed of the odd memory cell is slower than the even memory cell. Due to the concurrent execution of erase and erase identification of odd memory cell and even memory cell in a conventional advanced non-volatile memory, there is a wider distribution of the threshold voltage (Vt) in an erasing operation and has two peak values as shown in FIG. 4. FIG. 4 is a graph showing the distribution of erase threshold voltage for a conventional advanced non-volatile memory. As shown in FIG. 4, the threshold voltage of the odd memory cell is distributed between 1V to 2V (a threshold voltage spread of about 1V). The threshold voltage of the even memory cell is distributed between 0.8V to 1.8V (a threshold voltage spread of about 1V). Hence, overall spread of the threshold voltage is between 0.8V to 2V (an overall threshold voltage spread of about 1.2V) with two peak values. In other words, the spread of threshold voltage in an advanced non-volatile memory is relatively large.

Figure 5:
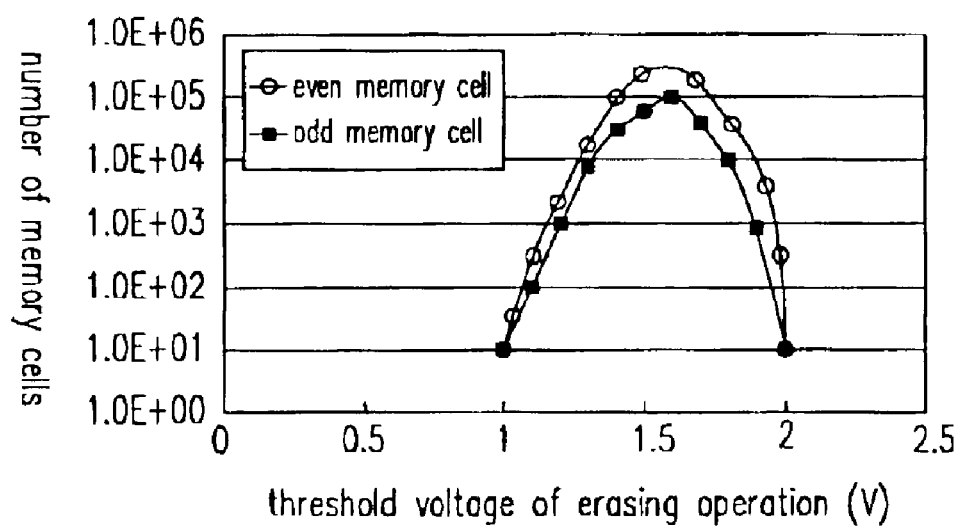
FIG. 5 is a graph showing the narrowed distribution of erase threshold voltage according to one preferred embodiment of this invention.

This invention provides a method of narrowing down the spread of the threshold voltage that can be applied to an advanced non-volatile memory having misaligned contacts. The method includes separating the erase and erase identification of an odd memory cell from the erase and erase identification of an even memory cell. FIG. 5 is a graph showing the narrowed distribution of erase threshold voltage according to one preferred embodiment of this invention. As shown in FIG. 5, the erase and erase identification of the odd memory cell is separated from the erase and erase identification of the even memory cell. For example, the erase and erase identification of the odd memory cell is carried out first so that the spread of threshold voltage is between 1V to 2V too (an overall threshold voltage spread of about 1V). Thereafter, the erase and erase identification of the even memory cell is carried out so that the threshold voltage spread is between 1V to 2V too (an overall threshold voltage spread of about 1V). Therefore, the method of this invention is able to narrow down the spread in threshold voltage. To simplify explanation, only the separation of erase and erase identification of odd memory cell from even memory cell is illustrated. However, anyone familiar with the technologies may notice that the invention can also be applied to separate the program and program identification of the odd memory cell from the program and program identification of the even memory cell to obtain the same narrowing of threshold voltage.

In summary, this invention utilizes the separation of the erase and erase identification of the odd memory cells from the erase and erase identification of the even memory cells to narrow the distribution of threshold voltage in an advanced non-volatile memory. Consequently, this invention is able to eliminate all the weaknesses caused by too large a spread in the threshold voltage as in a conventional advanced non-volatile memory.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A method of narrowing the distribution of threshold voltage in an advanced non-volatile memory having misaligned contacts, wherein the advanced non-volatile memory includes a plurality of odd memory cells and a plurality of even memory cells, comprising the steps of:

conducting an erase and erase identification of odd memory cells; and conducting an erase and erase identification of even memory cells, wherein the odd memory cell has an erasing speed that differs from the even memory cell.

2. The method of claim 1, wherein the odd memory cell has a gate-coupling rate smaller than the even memory cell so that the odd memory cell has an erasing speed slower than the even memory cell.

3. The method of claim 1, wherein the odd memory cell has a gate-coupling rate greater than the even memory cell so that the odd memory cell has an erasing speed faster than the even memory cell.

4. A method of narrowing the distribution of threshold voltage in an advanced non-volatile memory having mis-aligned contacts, wherein the advanced non-volatile memory includes a plurality of odd memory cells and a plurality of even memory cells, comprising the steps of:

conducting an erase and erase identification of odd memory cells; and conducting an erase and erase identification of even memory cells, wherein the odd memory cell has an erase identification speed that differs from the even memory cell.

5. The method of claim 4, wherein the odd memory cell has a gate-coupling rate smaller than the even memory cell so that the odd memory cell has an erase identification speed slower than the even memory cell.

6. The method of claim 4, wherein the odd memory cell has a gate-coupling rate greater than the even memory cell so that the odd memory cell has an erase identification speed faster than the even memory cell.

* * * * *